United States Patent [19]

Rauth et al.

[11] Patent Number: 4,564,061

[45] Date of Patent: Jan. 14, 1986

[54] COOLING SYSTEM FOR COMMUNICATIONS DEVICES WITH HIGH POWER LOSSES

[75] Inventors: Erich Rauth, Auenwald; Ernst Form, Sulzbach, both of Fed. Rep. of Germany

[73] Assignee: ANT Nachrichtentechnik GmbH, Backnang, Fed. Rep. of Germany

[21] Appl. No.: 450,425

[22] Filed: Dec. 16, 1982

[30] Foreign Application Priority Data

Dec. 18, 1981 [DE] Fed. Rep. of Germany ....... 3150166

[51] Int. Cl.$^4$ .................... F28D 15/00; H01F 27/10
[52] U.S. Cl. .................. 165/104.33; 165/104.19; 165/45; 165/185; 62/3; 361/385
[58] Field of Search ............ 165/104.33, 104.14, 165/104.21, 104.19, 45, 80 C; 361/385; 174/15 R, 15 HP

[56] References Cited

U.S. PATENT DOCUMENTS

| | | | |
|---|---|---|---|
| 2,181,953 | 12/1939 | Usselman | 165/45 |
| 3,461,952 | 8/1969 | Decker et al. | 165/104.33 |
| 4,044,396 | 8/1977 | Haws et al. | 165/80 C |
| 4,293,030 | 10/1981 | Rambach | 361/385 |

FOREIGN PATENT DOCUMENTS

| | | |
|---|---|---|
| 971999 | 5/1959 | Fed. Rep. of Germany . |
| 1191901 | 4/1965 | Fed. Rep. of Germany . |
| 2209938 | 9/1973 | Fed. Rep. of Germany . |
| 2638702 | 3/1978 | Fed. Rep. of Germany . |
| 2712017 | 3/1978 | Fed. Rep. of Germany . |
| 2753914 | 6/1979 | Fed. Rep. of Germany . |
| 581420 | 10/1976 | Switzerland . |

OTHER PUBLICATIONS

Data Sheet 5, Thermoelectric Cooling Modules, Performance Data, pp. 1-8, Jan., 1966, De La Rue Frigistor Limited.

"Thermoelectric Heat Pumps Cool Pachages Electronically", Electronics, Jul. 31, 1980 pp. 109–113 by Dale A. Zeskind.

Primary Examiner—Albert W. Davis, Jr.
Attorney, Agent, or Firm—Spencer & Frank

[57] ABSTRACT

A cooling system for communications equipment includes a closed container for housing the equipment and protecting the equipment against environmental influences. The container has an outer wall made of heat conductive material and is constructed for at least partial burial in the earth and for a heat transfer relationship therewith. A fluid filled conduit system includes conduits disposed outside the container and in heat transfer relationship with the outer wall thereof. The conduits outside the container are arranged to be buried in the earth for a heat transfer relationship with the earth. Heat conducting means are in thermal contact with the equipment and the container wall for transmitting heat generated by the equipment to the wall and to the conduit system. Thus, heat generated by the equipment is transferred to the fluid and heat in the fluid is transferred to the earth, and the fluid is circulated in the conduit system solely due to temperature and density variations of the fluid.

20 Claims, 11 Drawing Figures

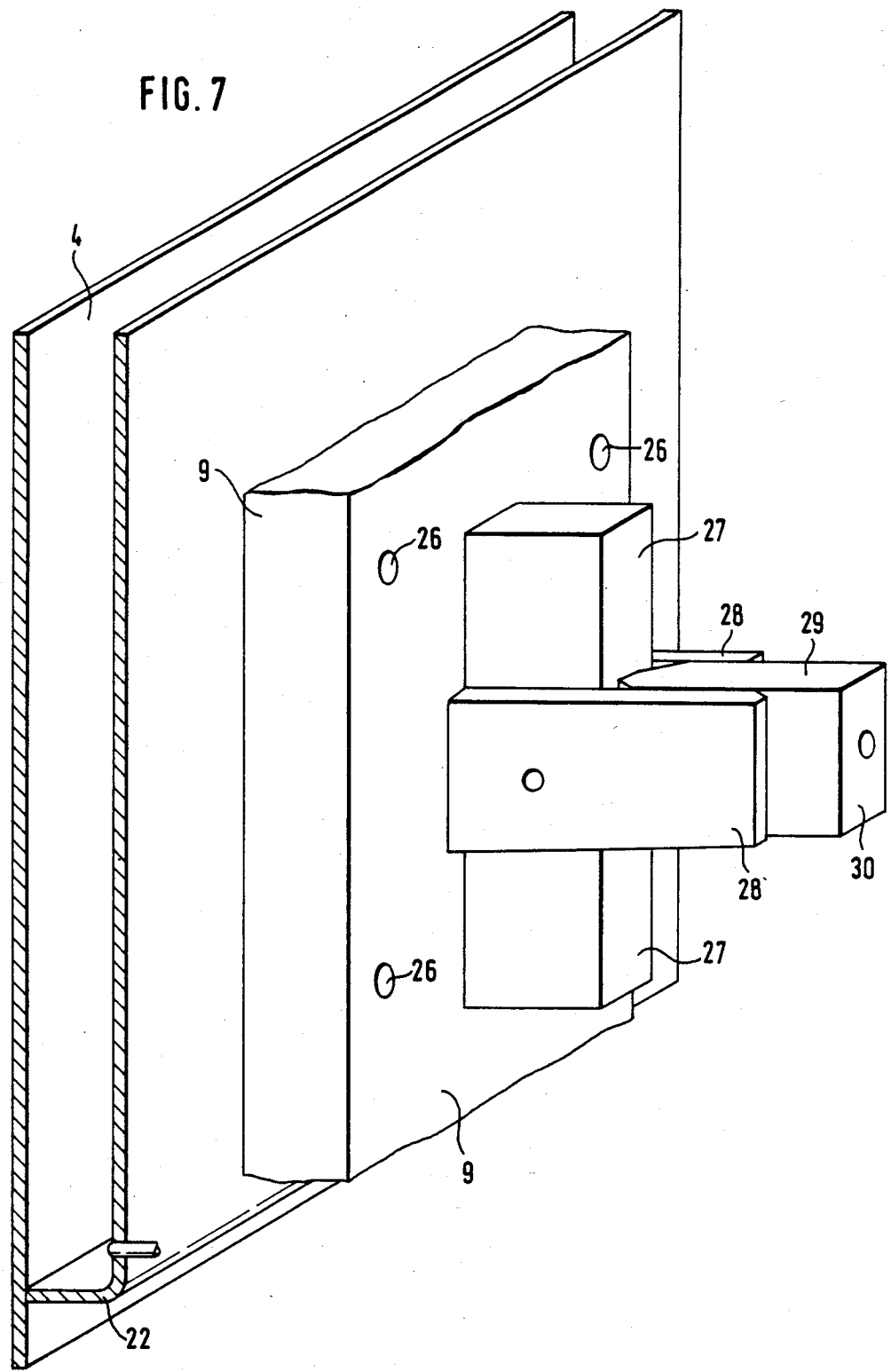

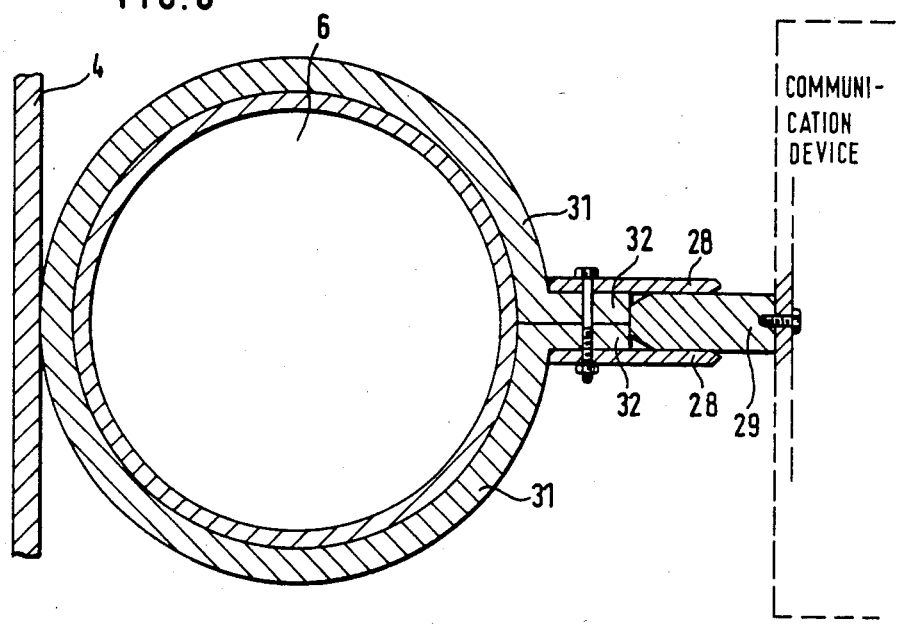
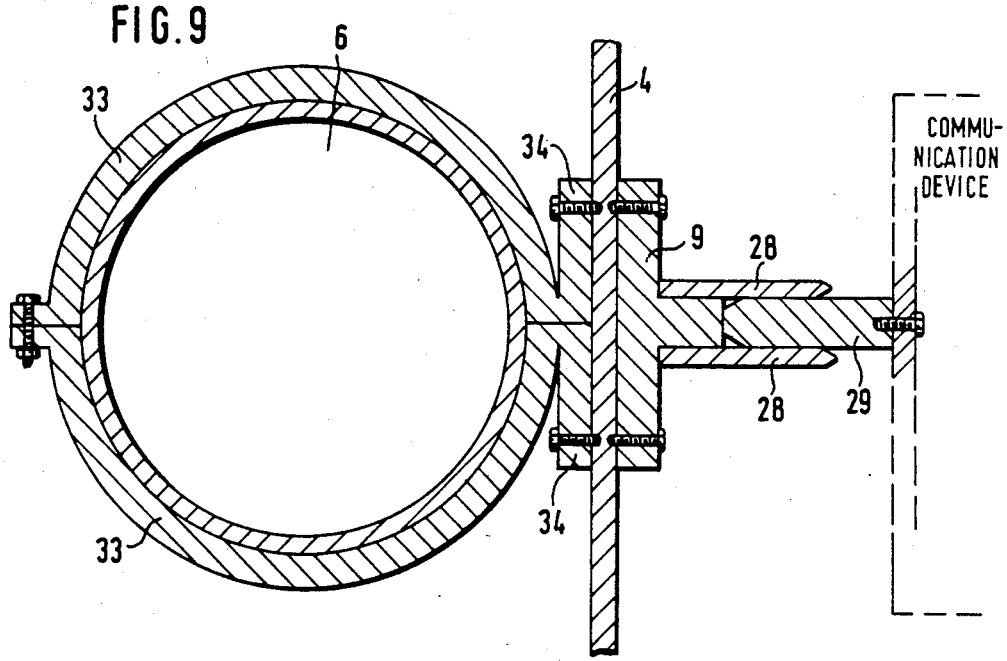

COOLING SYSTEM FOR COMMUNICATIONS DEVICES WITH HIGH POWER LOSSES

BACKGROUND OF INVENTION

The present invention relates to a cooling system for communications devices which incur high power losses. More particularly, the invention relates to a cooling system for communications devices disposed in a closed container for protection against environmental influences and wherein the communications devices are in thermal contact with a heat exchanger associated with the container, whereby the heat generated by the communications devices is dissipated in part to a fluid filled conduit system disposed outside the container and the fluid is circulated in the conduit system solely as a result of differences in temperature and density.

German Pat. No. 2,712,017 discloses a cooling system in which a container is disposed in an open-air environment and is provided with a housing which is insulated against such environment. Cooling takes place via a heat exchanger in which circulating air in the container is in heat exchange relationship with a fluid disposed in a compartment within the container and the fluid is, in turn, in heat exchange relationship with the environment. This arrangement compensates for temperature fluctuations between day and night. That is, the heat generated during the day is stored and discharged during the night. This combined heating and cooling system is not suitable for the continuous discharge of large quantities of heat.

SUMMARY OF THE INVENTION

It is therefore an object of the present invention, in connection with a cooling system of the above-mentioned type, to prevent excess temperatures from occurring in communications devices as a result of their power losses.

The above and other objects are accomplished by the present invention wherein a cooling system for communications equipment includes a closed container for housing the equipment and protecting the equipment against environmental influences. The container has an outer wall made of heat conductive material and is constructed for at least partial burial in the earth and for a heat transfer relationship therewith. A fluid filled conduit system includes conduits disposed outside the container and in heat transfer relationship with the outer wall thereof. The conduits outside the container are arranged to be buried in the earth for a heat transfer relationship with the earth. Heat conducting means are in thermal contact with the equipment and the container wall for transmitting heat generated by the equipment to the wall and to the conduit system. Thus, heat generated by the equipment is transferred to the fluid and heat in the fluid is transferred to the earth, and the fluid is circulated in the conduit system solely due to temperature and density variations of the fluid.

The advantages of the invention include a secure and defined heat transfer since circulation of air for heat transfer is not required. By discharging part of the generated heat through the container walls to the surrounding earth, large quantities of heat can be dissipated. Heat is also dissipated via the conduit system which is preferably installed in cable ditches that carry the communications cables associated with the communications equipment in the container.

The invention will now be explained in greater detail with the aid of the drawings.

BRIEF DESCRIPTION OF THE DRAWINGS

FIG. 7 is an example for heat conductive means, the conduit system being partially inside the container.

FIG. 8 is an example for heat conductive means mounted to vertical pipes inside the container.

FIG. 9 is an example for heat conductive means mounted between communication devices and the container sidewall and outer vertical pipes as well.

DESCRIPTION OF THE PREFERRED EMBODIMENTS

Figure 1:
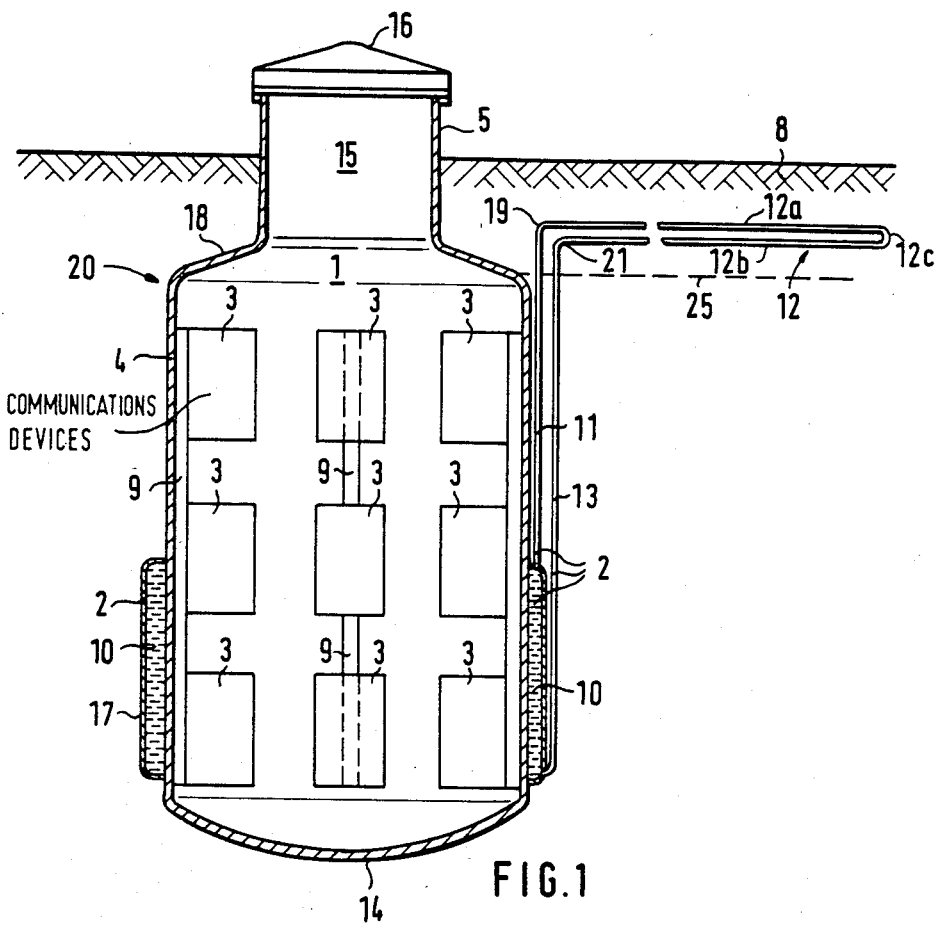
FIG. 1 is a cross sectional view of a cooling system attached to the exterior wall of a container in accordance with one embodiment of the invention.

FIG. 1 is a sectional view of a container 1 which houses communications devices or equipment 3. Container 1 comprises a shell or outer wall 20 having a side wall 4 connected at its lower end to a bottom 14. At its upper end, wall 4 has an inwardly inclined section 18 which joins a neck 5 which projects out of the ground 8. Neck 5 forms an opening 15 which is sealed with a removable closure element 16. Container 1 is buried in the earth and opening 15 presents the only entrance opening to the environment of container 1.

Container 1 serves as a mechanical and moisture-proof protection for communications devices 3 which are fastened to heat conducting bus bars 9. Communications devices 3 are arranged in vertical groups and all of the devices of each group are fastened to a respective one of bars 9.

A conduit system 2, including conduits 11, 12 and 13, vessel 17 and fluid 10, is entirely disposed outside container 1. Heat conductive bridges provide thermal contact betweenn communication devices 3 and both conduit system 2 and shell 20 of container 1. Heat generated by communications devices 3 is thus in part absorbed by shell 20 and, by way of heat exchange, is transferred to the earth and to fluid 10 within conduit system 2.

Shell 20 is preferably made of steel and is therefore a good heat conductor and facilitates heat transfer to the surrounding earth. Preferably, the space between shell 20 and the wall of the excavated shaft into which container 1 is placed is filled with sand, such as quartz sand, to assure good heat transfer to the surrounding undisturbed earth which is at ambient earth temperature.

Vessel 17 is a cuff-like vessel attached to the lower region of side wall 4. In the upper region of cuff-like vessel 17, there is disposed a connection to conduit or riser pipe 11 for forward fluid flow and in the lower region there is a connection to conduit or down pipe 13 for return fluid flow. Heated fluid 10 ascends in riser pipe 11 which is joined to an end 19 of an upper leg 12a of pipe coil 12 in the region where section 18 of shell 20 joins neck 5. Pipe coil 12 has a leg 12b disposed below and parallel to leg 12a. Leg 12b joins leg 12a at a bend 12c and has an end 21 which opens into down pipe 13 for conducting cooled fluid 10 to vessel 17. Pipe coil 12 is buried in the ground parallel to the top of the ground and may be conveniently buried in the same ditch into which are installed the communications cables (not shown) leading to communications devices 3 in container 1. The lower edge 25 of the cable ditch is shown in dashed lines in FIG. 1. Pipe coil 12 is made of good heat conducting material and is also preferably embedded in sand so that good heat exchange can take place with the surrounding earth.

The above described conduit system may be modified in a number of ways. For example, a plurality of cuff-like vessels 17 connected together by means of pipes may be provided around shell 20. In addition, a plurality of pipe coils may be provided, for example, in different cable ditches, to form a branched conduit system.

Fluid circulation in conduit system 2 is maintained solely by changes in temperature and density. This free circulation depends on a temperature difference $\Delta T$ between undisturbed earth and the advancing temperature of fluid 10. Fluid circulation is further dependent on the difference in height h between cuff-like vessel 17 and pipe coil 12. To produce free circulation, $\Delta T$ and $\Delta h$ must be selected so that a circulating pressure is generated which overcomes the flow resistance in conduit system 2, which flow resistance is essentially given by the pipe friction and the viscosity of the fluid 10.

Water may be used as the circulating fluid or some other fluid which has high thermal capacity and a low viscosity. As protection against freezing, an antifreeze agent may be mixed with the fluid.

Figure 5:
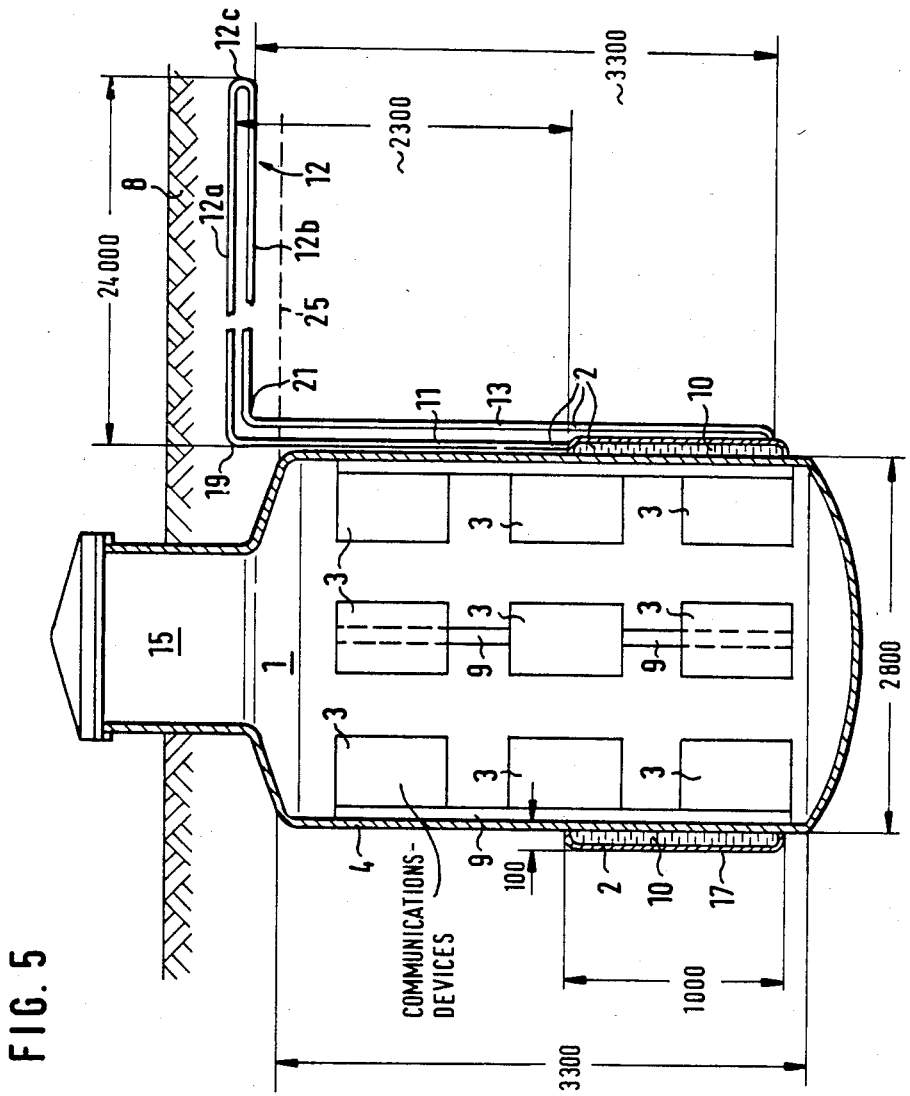
FIG. 5 is a specific example of a cooling system according to the invention.

FIG. 5 shows a specific example of a cooling system according to the invention. All dimensions entered in FIG. 5 are in mm (millimeters). The cylindrical main part of container 1 is 3300 mm high. The diameter of this cylindrical main part is 2800 mm. The cylindrical main part is buried 1000 mm below ground 8. Vessel 17 attached to the lower region of side wall 4 is 1000 mm high and 100 mm broad. The thickness of the container wall is 7 mm. Pipes 11, 12 and 13 have a diameter of 1 inch. Pipe 11 is approximately 2300 mm long and pipe 13 is 3300 mm long. Pipes 12a and 12b are each approximately 24,000 mm long and approximately 1000 mm below ground 8. Such dimensions for pipes 12a and 12b results in the assumption that the temperature difference $\Delta T$ between undisturbed earth and the advancing temperature of fluid 10 is 20° centigrade, and that the power to be dissipated is approximately 1, 1 kW. All pipes being commercially available steel pipes. The absolute temperature values will be 35° centigrade for the advancing temperature and 15° centigrade for the return fluid temperature. $\Delta h$ is assumptioned to be 2800 mm, which leads to a pressure for a free circulation of the fluid of approximately 16 Pascal.

Figure 2:
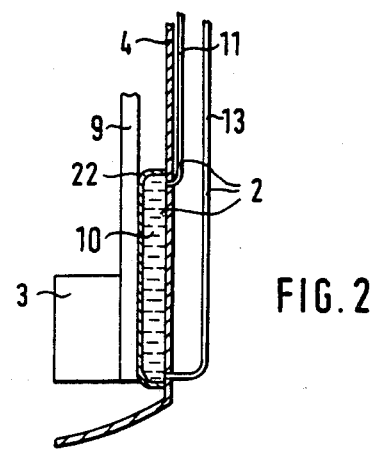
FIG. 2 is a partial sectional view of an alternative embodiment of the invention in which a cooling system has part of its conduits extending partially within the container.

FIG. 2 shows another embodiment of the cooling system according to the invention. In this case an annularly shaped cuff-like vessel 22 which forms part of conduit system 2 is attached to the interior of side wall 4. Communications devices 3 are again in communication which heat conducting bus bars 9 via heat conductive bridges, and bus bars 9 are in thermal contact with cuff-like vessel 22. The other parts of the cooling system correspond to those of FIG. 1.

Figure 3:
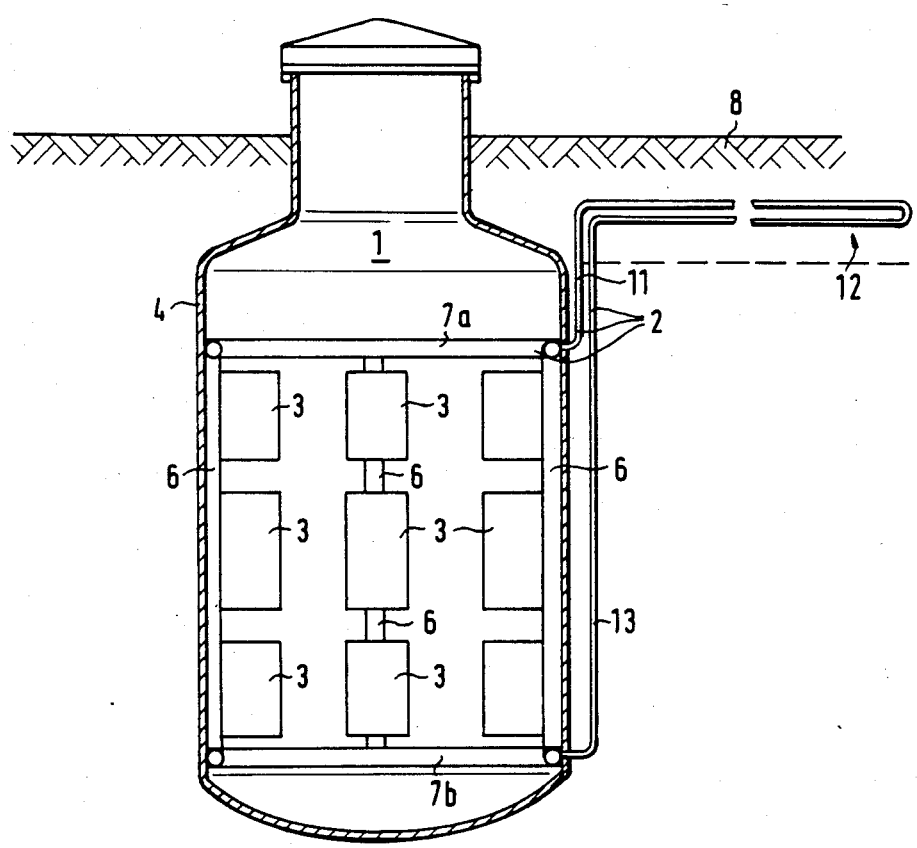
FIG. 3 is a cross sectional view of a cooling system having vertical pipes which are connected with one another by way of annular conduits according to a further embodiment of the invention.
Figure 4:
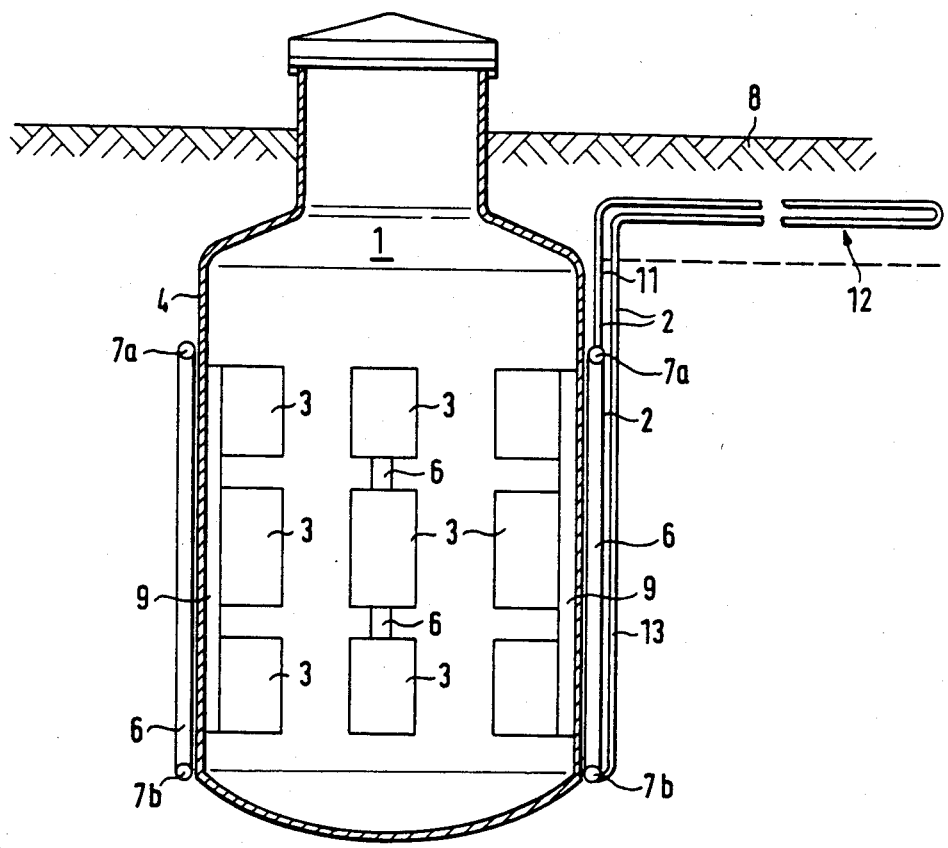
FIG. 4 is a cross sectional view of a cooling system having vertical pipes outside the container, which are connected with one another by way of annular conduits outside the container, too.

A further embodiment of the invention is shown in FIG. 3. Communications devices 3 are arranged in vertical groups as in FIG. 1, however, all of the devices of each group are in thermal contact with a respective one of vertical pipes 6 which form part of the cooling system. Vertical pipes 6 open at their ends into upper and lower annular conduits 7a and 7b may be attached, as shown in FIG. 3, in the interior of container 1. Alternatively, as shown in FIG. 4, conduits 7a and 7b and vertical pipes 6 may be attached to the outside of container 1. Upper annular conduit 7a is connected to riser pipe 11 for the forward flow while lower annular conduit 7b is connected to down pipe 13 for communication with the return flow. The fluid circulation operates in the same manner as in the first described embodiment illustrated in FIG. 1. Thermal contact between communication devices 3 and conduit system 2 is provided by heat conductive bridges arranged between communication devices 3 and side wall 4, which is in thermal contact with the conduit system 2 outside the container. The following FIGS. 6 to 9 show several examples for heat conductive bridges in view of the varieties of cooling systems shown in FIGS. 1 to 4.

Figure 6:
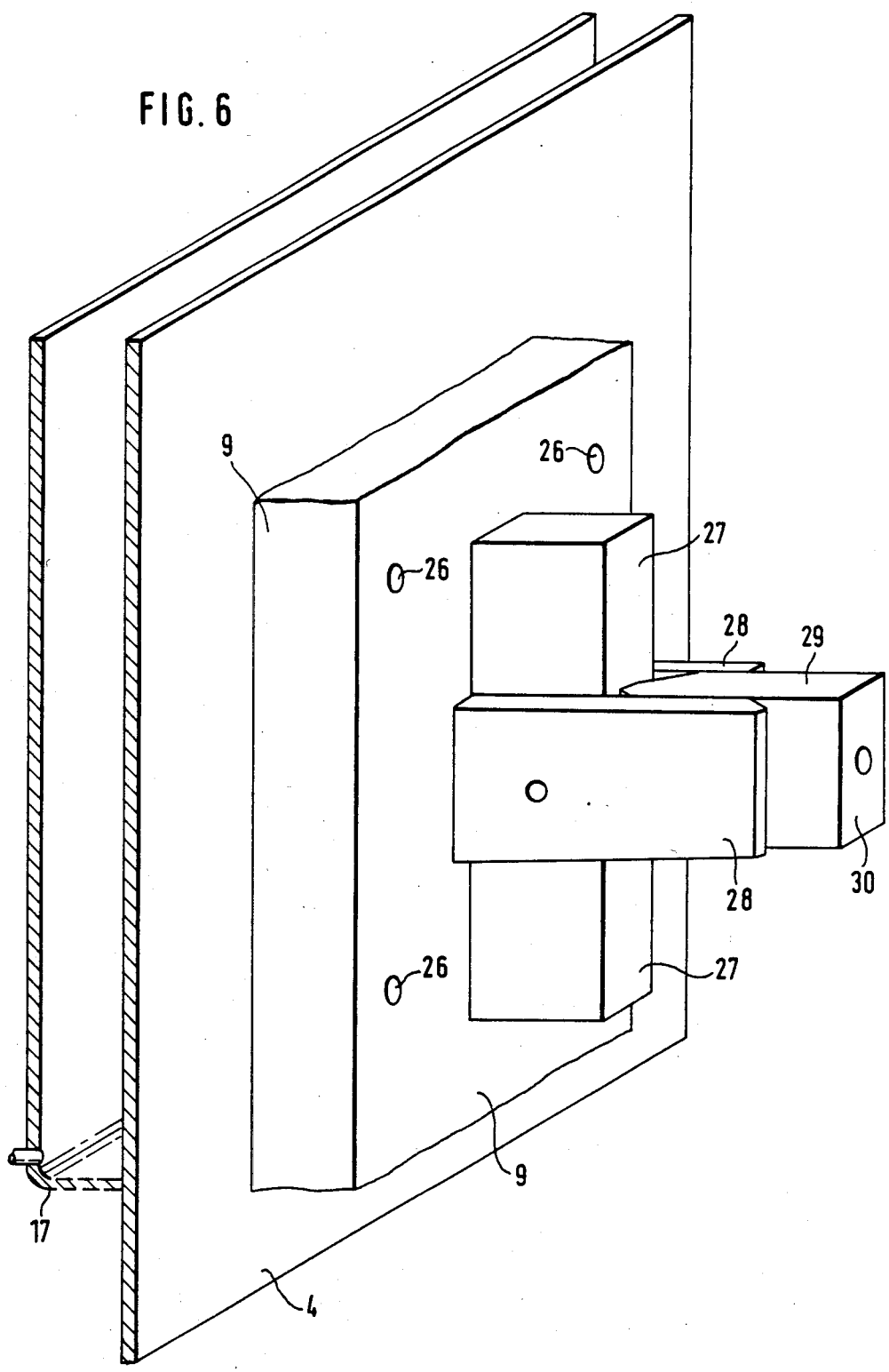
FIG. 6 is an example for heat conductive means, the conduit system being outside the container.

In FIG. 6 vessel 17 is attached by welding at the outside of side wall 4 as can be seen in FIG. 1. Bar 9, only a part of which is shown in FIG. 6, is mounted to sidewall 4 by bolts, which can be welded at the inner side wall 4 and which may tower through holes 26. Bars 9 are preferably out of aluminium. At the front end 27 of bar 9 each of two mounting bands 28 for each heat producing communication device is attached, preferably by screws. These mounting bands 28 are made of copper and are slightly inclined at their outer edges so as to fix a support mean 29 by elasticity and good thermal contact. Support mean 29, also made of copper, has a front plane 30 to which a communication device can be attached.

In FIG. 7 an annularly shaped cuff-like vessel 22, as shown in FIG. 2, is attached to the interior of side wall 4. Vessel 22 is welded to the inner side of wall 4. Bar 9 can be mounted by bolts, as described in connection with FIG. 6. The communication devices can be mounted as in FIG. 6.

The heat conductive bridge of FIG. 8 is mounted to a vertical pipe 6 inside the container as shown in FIG. 3. This can be done by sleeve joints of tubing 31, which have front ends 32, formed similar to the front end of bar 9 in FIG. 6.

In the case of mounting the vertical pipes 6 outside the container, as shown in FIG. 4, the communication devices are in thermal contact with the inner side of side wall 4 via bars 9, mounting bands 28 and support means 29. The vertical pipes 6 are in thermal contact with the outer side of said side wall 4 via sleeve joints of tubing 33, whose front ends 34 can be attached to the side wall 4 by bolts.

The heat conductive bridges, i.e. the points of thermal contact between communications devices 3 and bars 9 or side wall 4 of the cuff-like vessel, respectively, may alternatively be provided in the form of Peltier elements.

Figure 10:
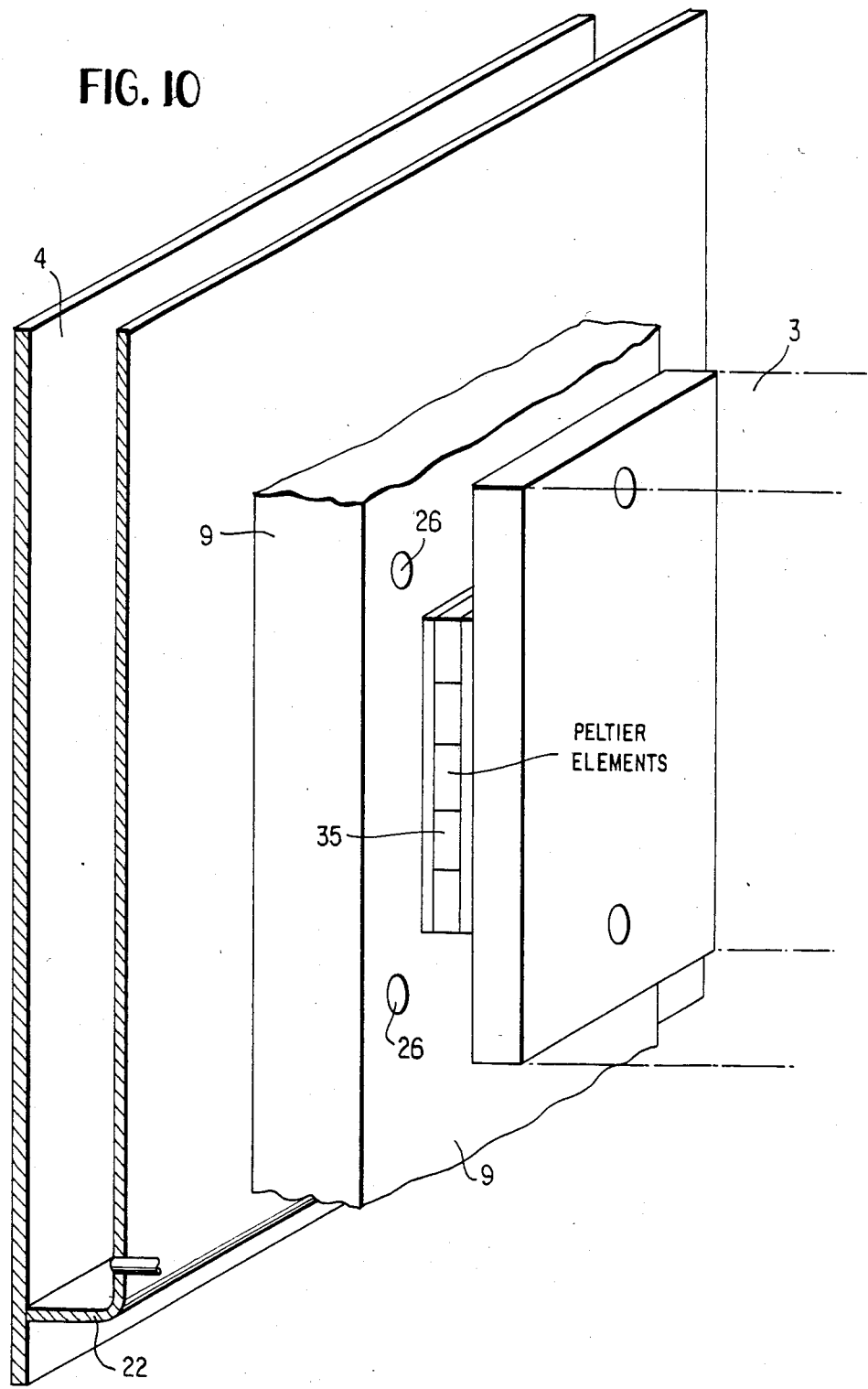
FIG. 10 is a modification of FIG. 7 showing the heat conductive means in the form of Peltier elements.

FIG. 10 illustrates Peltier elements 35 mounted between a communications device 3 and bar 9 in an embodiment similar to FIG. 7 wherein the cuff-like vessel 22 is attached to the interior of side wall 4.

Figure 11:
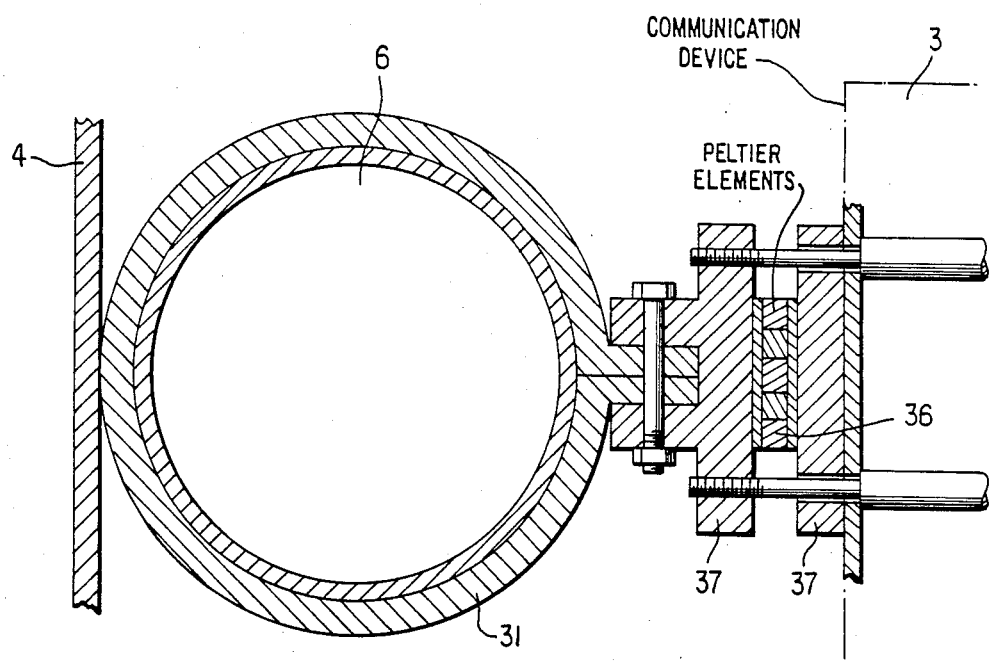
FIG. 11 is a modification of FIG. 8 showing the heat conductive means in the form of Peltier elements.

FIG. 11 is similar to FIG. 8 except that the communications device is connected to vertical pipe 6 via Peltier elements 36 which are held in place by a suitable clamping device 37. Peltier elements suitable as heat conducting bridges for the cooling system of the invention are described for example in Data Sheet 5, Thermoelectric Cooling Modules, Performance Data, pages 1-8, January, 1966, De La Rue Frigistor Limited. This publication also gives hints as how communication devices (modules) can be mounted to the cooling system (heat exchanger) according to the invention.

It will be understood that the above description of the present invention is susceptible to various modifications, changes and adaptations, and the same are intended to be comprehended within the meaning and range of equivalents of the appended claims.

What is claimed is:

1. A cooling system for communications equipment, said system comprising:
    a closed container for housing the equipment and protecting the equipment against environmental influences, said container having an outer wall made of heat conductive material, and said container being constructed for burial of a major portion of said container in the earth and for a heat transfer relationship therewith;
    a fluid filled conduit system including conduits disposed within said container and a conduit portion which is in heat transfer relationship with said outer wall and which has a fluid inlet positioned near the bottom of the container and a fluid outler positioned above the fluid inlet, said inlet and outlet being associated with said major portion, said conduit system further including outside disposed conduits arranged outside said container for burial in the earth and for a heat transfer relationship therewith, said outside disposed conduits including a riser conduit connected to said outlet for receiving heated fluid from said conduit portion and a down conduit connected to said inlet for delivering cooled fluid to said conduit portion; and
    heat conducting means in thermal contact with the equipment and said wall for transmitting heat generated by the equipment to said wall and to said conduit system, wherein heat generated by said equipment is transferred to the fluid in said conduit system and heat in said fluid is transferred to the earth, said fluid being circulated in said conduit system solely due to temperature and density variations of said fluid.

2. A cooling system as defined in claim 1, wherein the major portion of said container is buried in the earth and is in heat transfer relationship therewith.

3. A cooling system as defined in claim 1, wherein a portion of said outside disposed conduits are arranged to be buried in the earth parallel to the surface thereof.

4. A cooling system as defined in claim 3, wherein a major portion of said container and said outside disposed conduits are buried in the earth, said container and said outside disposed conduits both being in heat transfer relationship with the earth.

5. A cooling system as defined in claim 3, wherein a communications cable ditch exists in the earth in association with the communications equipment in the container and said portion of said outside disposed conduits are installed in the cable ditch parallel to the surface thereof.

6. A cooling system as defined in claim 1, wherein the communication equipment includes at least one group of communications devices, and said conduits within said container include upper and lower annular conduits and at least one vertical pipe having ends which open into said upper and lower annular conduits, respectively, and all of the communications devices of the at least one group are in thermal communication with said at least one vertical pipe via said heat conducting means.

7. A cooling system as defined in claim 1, wherein said fluid circulating in said conduit system is heat conducting and of low viscosity.

8. A cooling system as defined in claim 1, wherein said fluid circulating in said conduit system includes an antifreeze agent.

9. A cooling system as defined in claim 1, wherein said heat conducting means includes heat conducting bridges and said equipment is in thermal communication with said wall and said conduit system only via said heat conducting bridges.

10. A cooling system for communications equipment, said system comprising:
    a closed container for housing the equipment and protecting the equipment against environmental influences, said container having an outer wall made of heat conductive material, and said container being constructed for burial of a major portion of said container in the earth and for a heat transfer relationship therewith;
    a fluid filled conduit system including a conduit portion which is in heat transfer relationship with said outer wall and which has a fluid inlet positioned near the bottom of the container and a fluid outlet positioned above the fluid inlet, said inlet and outlet being associated with said major portion, said conduit system further including outside disposed conduits arranged outside said container for burial in the earth and for a heat transfer relationship therewith, said outside disposed conduits including a riser conduit connected to said outlet for receiving heated fluid from said conduit portion and a down conduit connected to said inlet for delivering cooled fluid to said conduit portion; and
    heat conducting means comprising Peltier elements, said equipment being in thermal communication with said wall and said conduit system only via said Peltier elements for transmitting heat generated by the equipment to said wall and to said conduit system, wherein heat generated by said equipment is transferred to the fluid in said conduit system and heat in said fluid is transferred to the earth, said fluid being circulated in said conduit system solely due to temperature and density variations of said fluid.

11. A cooling system as defined in claim 10, wherein the major portion of said container is buried in the earth and is in heat transfer relationship therewith.

12. A cooling system as defined in claim 10, wherein a portion of said outside disposed conduits are arranged to be buried in the earth parallel to the surface thereof.

13. A cooling system as defined in claim 10, wherein a major portion of said container and said outside disposed conduits are buried in the earth, said container and said outside disposed conduits both being in heat transfer relationship with the earth.

14. A cooling system as defined in claim 12, wherein a communications cable ditch exists in the earth in association with the communications equipment in the container and said portion of said outside disposed conduits are installed in the cable ditch parallel to the surface thereof.

15. A cooling system as defined in claim 10, wherein said conduit system is disposed entirely outside said container.

16. A cooling system as defined in claim 10, wherein said conduit system includes conduits which are disposed within said container.

17. A cooling system as defined in claim 16, wherein the communication equipment includes at least one group of communications devices, and said conduits within said container include upper and lower annular conduits and at least one vertical pipe having ends which open into said upper and lower annular conduits, respectively, and all of the communications devices of the at least one group are in thermal communication with said at least one vertical pipe via said heat conducting means.

18. A cooling system as defined in claim 15, wherein the communication equipment includes at least one group of communication devices, said outside disposed conduits include upper and lower annular conduits and at least one vertical pipe with which the communications devices of the at least one group are in thermal contact via said heat conducting means and said outer wall of said container, said at least one vertical pipe having ends which open into said upper and lower annular conduits, respectively.

19. A cooling system as defined in claim 10, wherein said fluid circulating in said conduit system is heat conducting and of low viscosity.

20. A cooling system as defined in claim 10, wherein said fluid circulating in said conduit system includes an antifreeze agent.

* * * * *